(12) United States Patent
Inoue et al.

(10) Patent No.: US 8,476,729 B2
(45) Date of Patent: Jul. 2, 2013

(54) SOLID-STATE IMAGING DEVICE COMPRISING THROUGH-ELECTRODE

(75) Inventors: Ikuko Inoue, Yokohama (JP); Kenichiro Hagiwara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 12/727,564

(22) Filed: Mar. 19, 2010

(65) Prior Publication Data

US 2010/0264503 A1    Oct. 21, 2010

(30) Foreign Application Priority Data

Apr. 16, 2009 (JP) .................. 2009-100068

(51) Int. Cl.
*H01L 31/0232* (2006.01)
(52) U.S. Cl.
USPC ............ 257/459; 257/432; 257/E31.127
(58) Field of Classification Search
USPC .................. 257/432, 459, E31.127
See application file for complete search history.

(56) References Cited

U.S. PATENT DOCUMENTS

| | | | |
|---|---|---|---|
| 6,489,675 | B1 | 12/2002 | Gruber et al. |
| 6,809,421 | B1* | 10/2004 | Hayasaka et al. ............. 257/777 |
| 2008/0050911 | A1* | 2/2008 | Borthakur .................... 438/622 |
| 2008/0128848 | A1* | 6/2008 | Suzuki et al. ................. 257/448 |
| 2008/0233740 | A1 | 9/2008 | Reinert |

FOREIGN PATENT DOCUMENTS

| | | |
|---|---|---|
| CN | 1657980 A | 8/2005 |
| JP | 10-223833 | 8/1998 |
| JP | 2007-53149 | 3/2007 |
| JP | 2007-214360 | 8/2007 |
| JP | 2008-205256 | 9/2008 |
| JP | 2009-65055 | 3/2009 |
| TW | 200512933 A | 4/2005 |
| TW | 200739894 A | 10/2007 |

OTHER PUBLICATIONS

H, Kurino, et al., "Intelligent Image Sensor Chip with Three Dimensional Structure", Dept. of Machine Intelligence and Systems Engineering, 1999, pp. 879-882.

"Nikkei Microdevices", CSP (chip-scale package) Apr. 1998, pp. 28, 164 and 176.

Chinese Office Action issued Sep. 13, 2011 in patent application No. 201010127483.3 with English translation.

(Continued)

*Primary Examiner* — Lynne Gurley
*Assistant Examiner* — Vernon P Webb
(74) *Attorney, Agent, or Firm* — Oblon, Spivak, McClelland, Maier & Neustadt, L.L.P.

(57) ABSTRACT

A solid-state imaging device includes an imaging element, an external terminal, an insulating film, a through-electrode and a first electrode. The imaging element is formed on a first major surface of a semiconductor substrate. The external terminal is formed on a second major surface opposing the first major surface of the semiconductor substrate. The insulating film is formed in a through-hole formed in the semiconductor substrate. The through-electrode is formed on the insulating film in the through-hole and electrically connected to the external terminal. The first electrode is formed on the through-electrode on the first major surface of the semiconductor substrate. When viewed from a direction perpendicular to the first major surface of the semiconductor substrate, an outer shape with which the insulating film and the semiconductor substrate are in contact is larger than an outer shape of the first electrode.

3 Claims, 8 Drawing Sheets

OTHER PUBLICATIONS

Combined Taiwanese Office Action and Search Report issued Dec. 22, 2012 in Taiwanese Patent Application No. 099105507 (with English-language translation).

Japanese Office Action dated Mar. 19, 2013, in Japanese Patent Application No. 2009-100068, filed Apr. 16, 2009 (with English Translation).

* cited by examiner

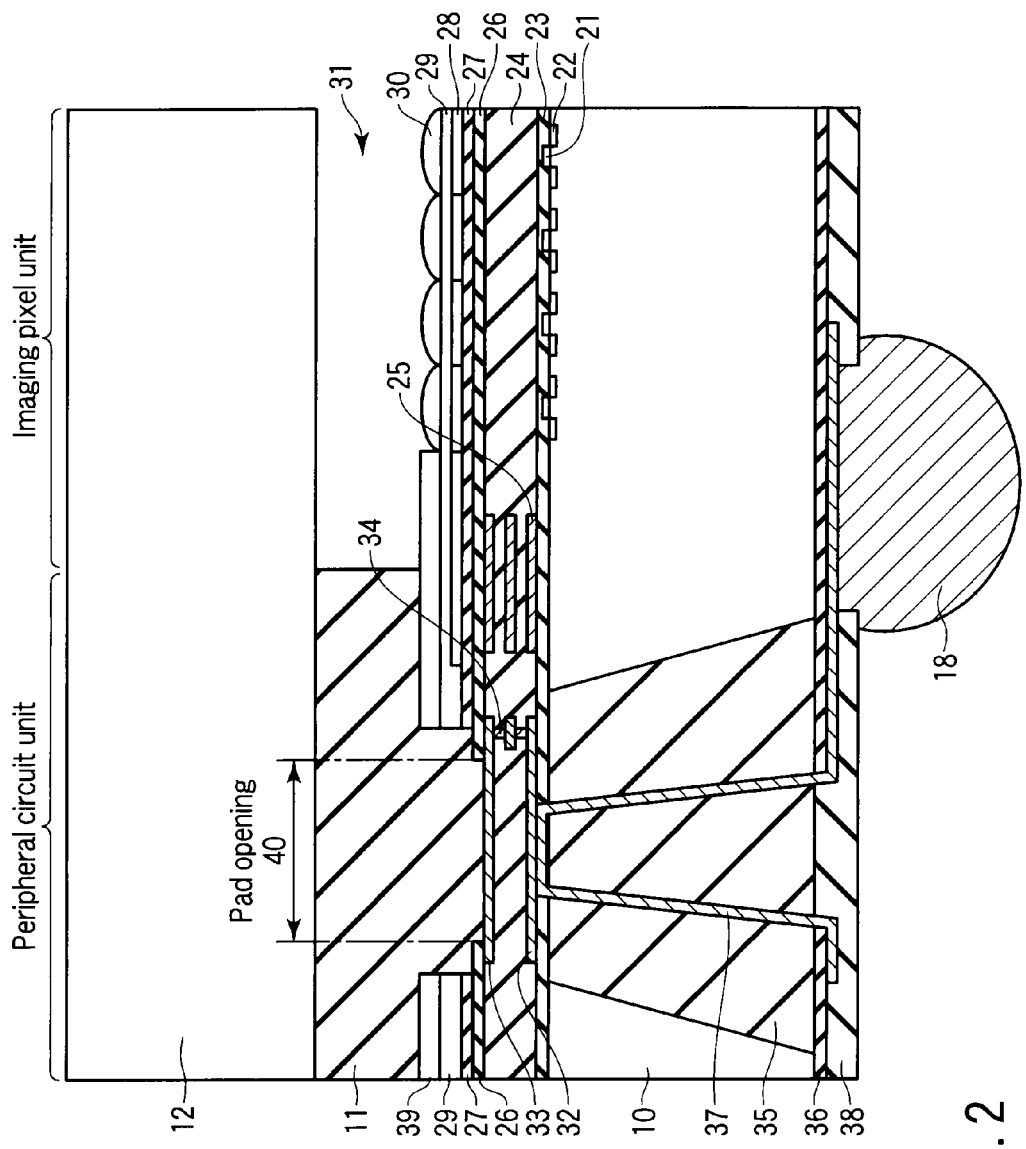
F I G. 2

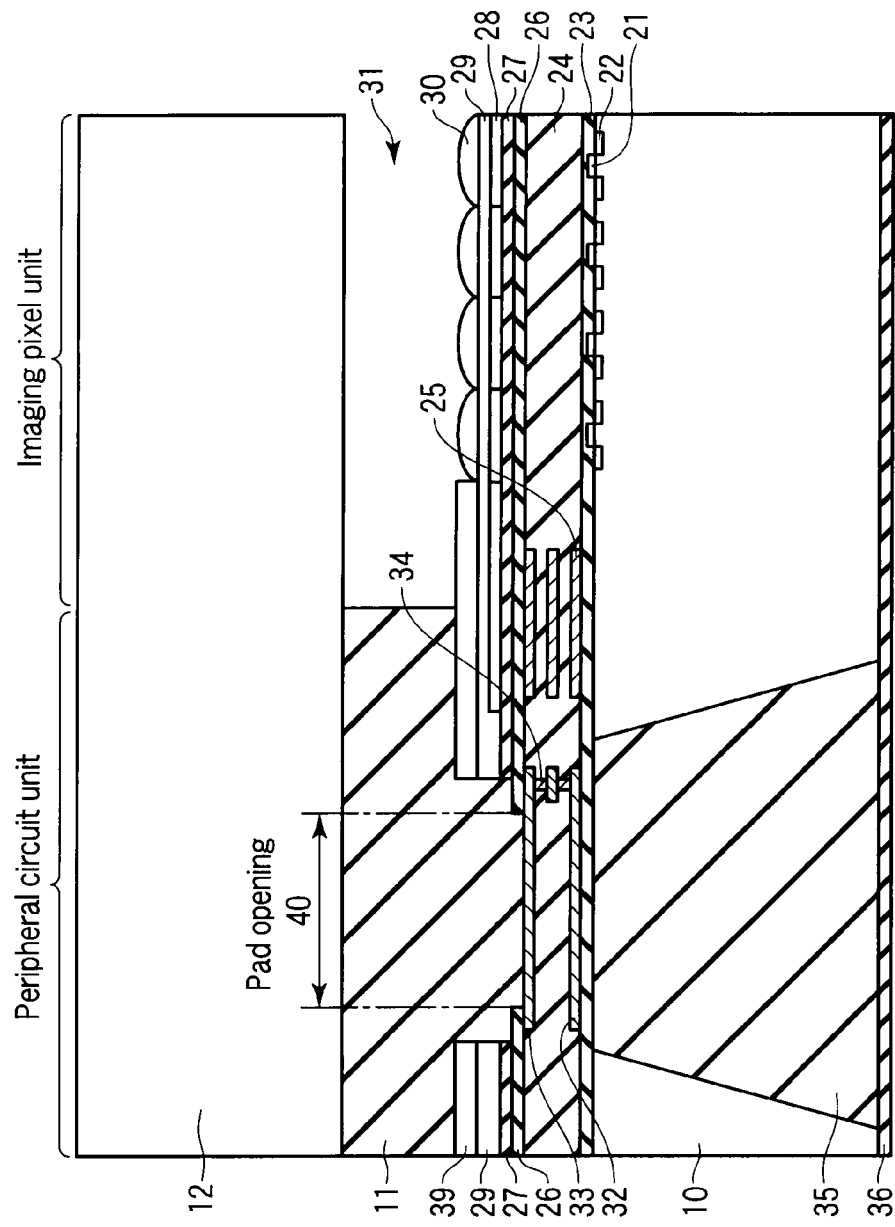
F I G. 4

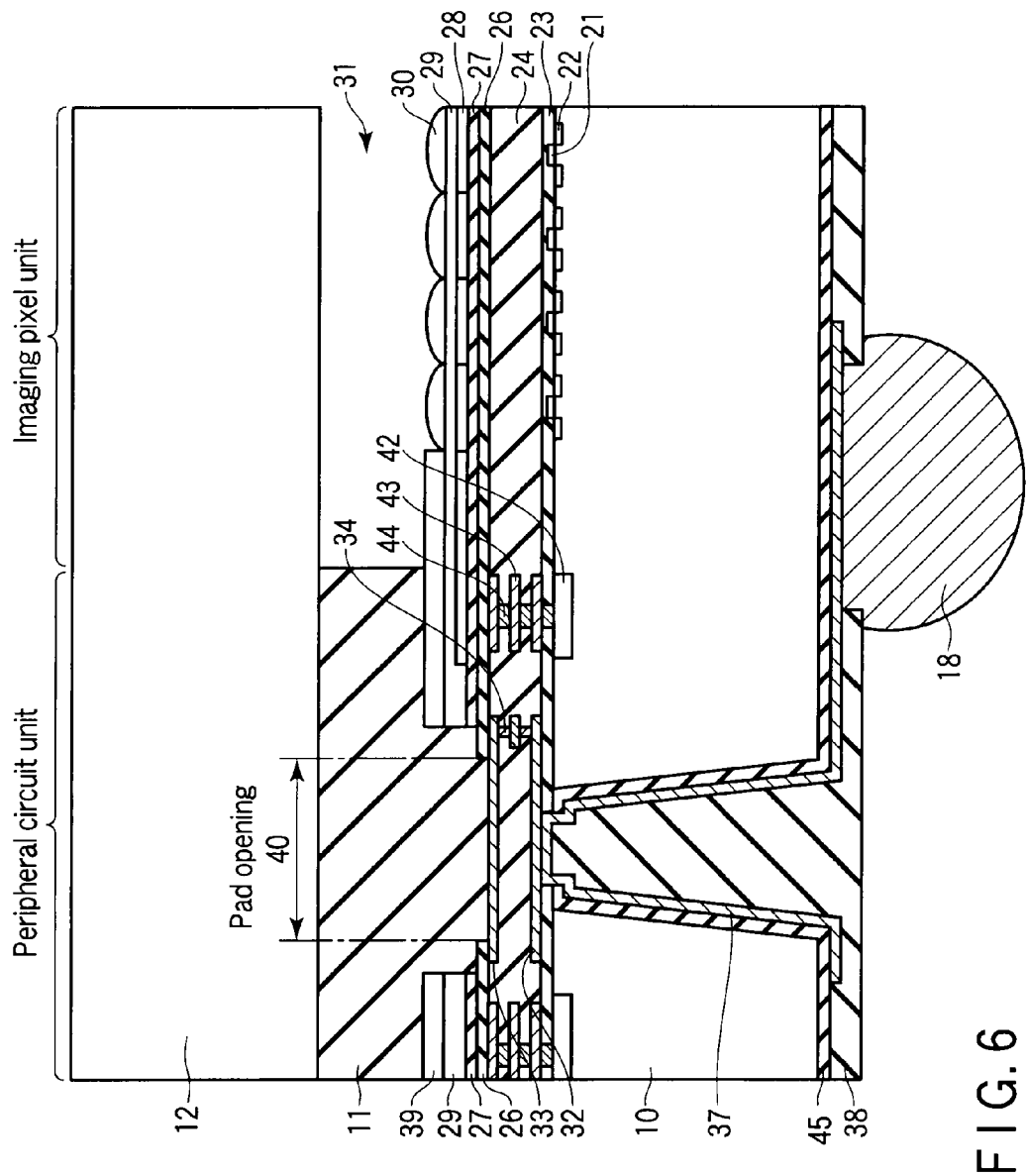
F I G. 6

SOLID-STATE IMAGING DEVICE COMPRISING THROUGH-ELECTRODE

CROSS-REFERENCE TO RELATED APPLICATIONS

This application is based upon and claims the benefit of priority from prior Japanese Patent Application No. 2009-100068, filed Apr. 16, 2009, the entire contents of which are incorporated herein by reference.

BACKGROUND OF THE INVENTION

1. Field of the Invention

The present invention relates to a solid-state imaging device comprising a through-electrode formed on a semiconductor substrate, for example, a camera module.

2. Description of the Related Art

With the miniaturization of electronic equipment, semiconductor devices to be mounted in such equipment need to be miniaturized and integrated at high density. In the late 1990's, research into the practical application of a wafer-level chip-scale package (CSP) began (for example, see Nikkei Microdevices, April, 1998, pp. 28, 164, and 176). This is a flip-chip method using no lead wire, the method including connecting a substrate and a semiconductor chip by a bump such that the surface of the semiconductor chip faces downward.

In contrast, the development of a stacked package (multi-chip package) in which a plurality of semiconductor chips are three-dimensionally stacked to realize considerable miniaturization has been in progress since the late 1990's. A package using a through-electrode has been proposed (for example, see Jpn. Pat. Appln. KOKAI Publication No. 10-223833). Research into a wafer level CSP for an optical element began in about 2000.

In International Electron Devices Meeting 1999 Technical Digest pp. 879 to 882, a structure of glass+adhesive layer+image sensor+through-electrode by Koyanagi et al. and an actually created sectional photograph are described. Similarly, also in the specification of U.S. Pat. No. 6,489,675 and Jpn. Pat. Appln. KOKAI Publication No. 2007-53149, a sectional structure of an optical element comprising a through-electrode and an optically transparent support substrate is disclosed.

However, since the through-electrode proposed by all the documents is formed in a silicon semiconductor substrate, because of a coupling between a through-electrode and a silicon semiconductor substrate, a high ground resistance near the through-electrode, or the like, power supplied from a pad through the through-electrode is degraded. In contrast to this, because of power supply noise generated by a silicon semiconductor substrate side, a desired preferable voltage waveform cannot be achieved.

BRIEF SUMMARY OF THE INVENTION

According to a first aspect of the present invention, there is provided a solid-state imaging device comprising: an imaging element formed on a first major surface of a semiconductor substrate; an external terminal formed on a second major surface opposing the first major surface of the semiconductor substrate; an insulating film formed in a through-hole formed in the semiconductor substrate; a through-electrode formed on the insulating film in the through-hole and electrically connected to the external terminal; and a first electrode formed on the through-electrode on the first major surface of the semiconductor substrate, wherein, when viewed from a direction perpendicular to the first major surface of the semiconductor substrate, an outer shape with which the insulating film and the semiconductor substrate are in contact is larger than an outer shape of the first electrode.

According to a second aspect of the present invention, there is provided a solid-state imaging device comprising: an imaging element formed on a first major surface of a semiconductor substrate; an external terminal formed on a second major surface opposing the first major surface of the semiconductor substrate; a through-electrode formed in a through-hole formed in the semiconductor substrate and electrically connected to the external terminal; a first electrode formed on the through-electrode on the first major surface of the semiconductor substrate; a semiconductor region formed on the semiconductor substrate to surround at least a part of a circumference of the through-electrode; and an interconnect layer formed on the semiconductor region and electrically connected to the semiconductor region, wherein a ground potential is supplied to the semiconductor region through the interconnect layer.

According to a third aspect of the present invention, there is provided a camera module comprising: a solid-state imaging device; an optically transparent substrate provided on the solid-state imaging device; an infrared cut filter provided on the optically transparent substrate; and an imaging lens provided on the infrared cut filter. The solid-state imaging device including: an imaging element formed on a first major surface of a semiconductor substrate; an external terminal formed on a second major surface opposing the first major surface of the semiconductor substrate; an insulating film formed in a through-hole formed in the semiconductor substrate; a through-electrode formed on the insulating film in the through-hole and electrically connected to the external terminal; and a first electrode formed on the through-electrode on the first major surface of the semiconductor substrate, wherein, when viewed from a direction perpendicular to the first major surface of the semiconductor substrate, an outer shape with which the insulating film and the semiconductor substrate are in contact is larger than an outer shape of the first electrode.

BRIEF DESCRIPTION OF THE SEVERAL VIEWS OF THE DRAWING

FIG. 2 is an enlarged sectional view showing parts of a silicon semiconductor substrate and a glass substrate in the camera module according to the first embodiment;

FIGS. 4 and 5 are a diagram showing a method of manufacturing a through-electrode in the camera module according to the first embodiment;

FIG. 6 is a sectional view showing a configuration of a camera module according to a second embodiment of the present invention;

DETAILED DESCRIPTION OF THE INVENTION

Figure 1:
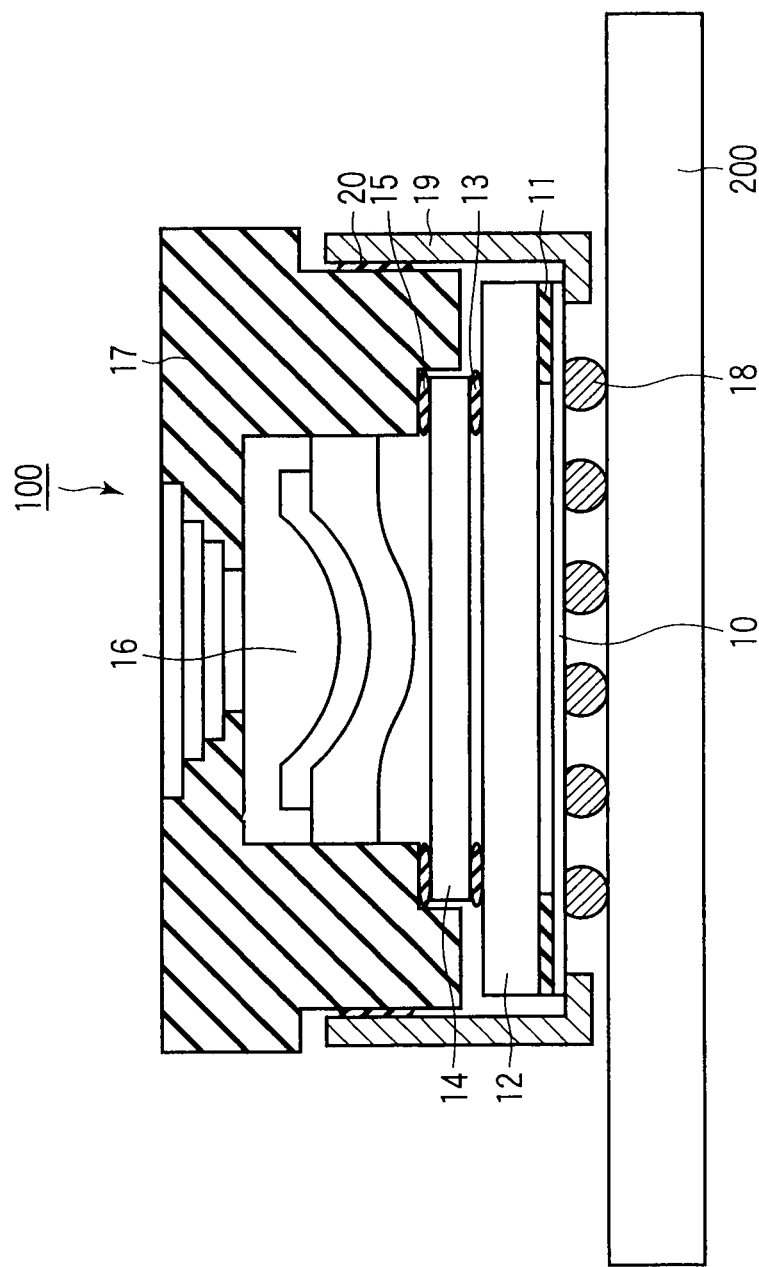
FIG. 1 is a sectional view showing a configuration of a camera module according to a first embodiment of the present invention.

Embodiments of the present invention will be explained with reference to the accompanying drawings. A camera module is exemplified as a solid-state imaging device. In this explanation, common reference numerals denote common parts over the drawings.

First Embodiment

A camera module according to a first embodiment of the present invention will be explained.

FIG. 1 is a sectional view showing a configuration of the camera module according to the first embodiment. On a first major surface of a silicon semiconductor substrate (imaging element chip) 10 on which an imaging element (not shown) is formed, an optically transparent support substrate, for example, a glass substrate 12 is formed through an adhesive agent 11. On the glass substrate 12, an infrared-cut filter 14 is arranged through an adhesive agent 13. Furthermore, on the infrared-cut filter 14, a lens holder 17 including an imaging lens 16 is arranged through an adhesive agent 15.

On a second major surface opposing the first major surface of the silicon semiconductor substrate 10, an external terminal (electrode), for example, a solder ball 18 is formed. An optical/electromagnetic shield 19 is arranged around the silicon semiconductor substrate 10 and the glass substrate 12. The optical/electromagnetic shield 19 is bonded to the lens holder 17 with an adhesive agent 20. With this structure, a camera module 100 is formed.

The camera module 100 is directly mounted (chip-on-board [COB]) on a mounting board 200 made of, for example, a resin or ceramic through the solder ball 18.

Sectional structures of the silicon semiconductor substrate 10 and the glass substrate 12 in FIG. 1 will be explained in detail.

FIG. 2 is an enlarged sectional view showing parts of a silicon semiconductor substrate and a glass substrate in the camera module according to the first embodiment. The camera module comprises an imaging pixel unit on which an imaging element 21 is formed and a peripheral circuit unit which processes a signal output from the imaging pixel unit.

The imaging pixel unit of the camera module has the following configuration.

On the first major surface of the silicon semiconductor substrate 10, an element isolation insulating layer (for example, a shallow trench isolation [STI]) 22 and an element region isolated by the element isolation insulating layer 22 are arranged. In the element region, the imaging element 21 including a photodiode and a transistor is formed.

On the first major surface on which the imaging element 21 is formed, an interlayer insulating film 23 is formed. An interlayer insulating film 24 is formed on the interlayer insulating film 23. Furthermore, an interconnect layer 25 is formed in the interlayer insulating film 24.

A passivation film 26 is formed on the interlayer insulating film 24. A base layer 27 is formed on the passivation film 26. Color filters 28 are arranged on the base layer 27 to correspond to the imaging elements 21, respectively.

An overcoat 29 is formed on the color filters 28, and microlenses 30 are formed on the overcoat 29 to correspond to the imaging elements 21 (or the color filters 28), respectively. Furthermore, a cavity 31 is formed above the microlenses 30.

An optically transparent support substrate (transparent substrate), for example, the glass substrate 12 is arranged above the cavity 31.

On the peripheral circuit unit of the camera module, the following through-electrode and electrode pad are formed. The interlayer insulating film 23 is formed on the first major surface of the silicon semiconductor substrate 10, and an internal electrode (first electrode) 32 is formed on the interlayer insulating film 23.

A through-hole is formed to extend from the second major surface of the silicon semiconductor substrate 10 to the interlayer insulating film 23 through the first major surface. An insulating film 35 is formed on the side surface and the bottom surface of the through-hole. An insulating film 36 is formed on the second major surface of the silicon semiconductor substrate 10.

On an internal surface (on the insulating film 35 and on a surface of the internal electrode 32 on the through-hole side) of the through-hole and on the insulating film 36, a through-electrode (conductive layer) 37 is formed. The internal electrode 32 is electrically connected to the imaging element 21 or a peripheral circuit (not shown) formed in the peripheral circuit unit.

On the through-electrode 37 and on the insulating film 36 on the second major surface, a protecting film, for example, a solder resist 38 is formed. Furthermore, on the second major surface, a part of the solder resist 38 on the through-electrode 37 is opened. On the exposed through-electrode 37, the solder ball 18 is formed. The through-electrode 37 formed in the through-hole electrically connects the solder ball 18 to the imaging element 21 or the peripheral circuit.

The solder resist 38 comprises, for example, a phenol resin, a polyimide resin, or an amine resin. As the solder ball 18, for example, Sn—Pb (eutectic) or 95Pb—Sn (high-lead refractory solder), Sn—Ag, Sn—Cu, or Sn—Ag—Cu serving as a Pb-free solder, or the like is used.

On the internal electrode 32, an element surface electrode (second electrode) 33 is formed through the interlayer insulating film 24. In the interlayer insulating film 24 between the internal electrode 32 and the element surface electrode 33, a contact plug 34 which electrically connects the electrodes to each other is formed. The element surface electrode 33 is used to apply a voltage and read a signal through, for example, the contact plug 34 and the internal electrode 32. In particular, in a die sort test, a test probe is brought into contact with the element surface electrode 33.

Furthermore, the passivation film 26 is formed on the element surface electrode 33. The base layer 27 is formed on the passivation film 26, and the overcoat 29 is formed on the base layer 27. Furthermore, a styrene-based resin layer 39 is formed on the overcoat 29.

The passivation film 26, the base layer 27, the overcoat 29, and the styrene-based resin layer 39 arranged on the element surface electrode 33 are opened to form a pad opening 40. On the styrene-based resin layer 39 and on the element surface electrode 33, the glass substrate 12 is formed through the adhesive agent 11. The adhesive agent 11 is patterned, and is not arranged on the imaging element 21 (or on the microlenses 30).

Figure 3:
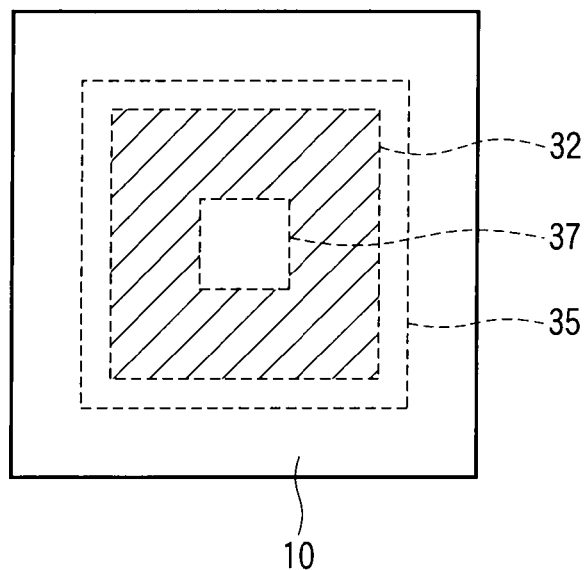
FIG. 3 is a diagram showing a peripheral circuit unit in FIG. 2 as viewed from a pad opening side.

FIG. 3 is a diagram showing a peripheral circuit unit in FIG. 2 as viewed from a pad opening side. FIG. 3 is a plan view showing a layout of the insulating film 35, the internal electrode 32, and the through-electrode 37. As shown in FIG. 3, the internal electrode 32 is arranged inside the insulating film 35, and the through-electrode 37 is arranged inside the internal electrode 32.

The insulating film 35 arranged between the through-electrode 37 and the silicon semiconductor substrate 10 in the through-hole insulates the through-electrode 37 and the silicon semiconductor substrate 10 from each other. As shown in FIGS. 2 and 3, in a direction parallel to the first major surface of the silicon semiconductor substrate 10, a film thickness of the insulating film 35 is about 300 to 1000 nm. The outer shape of the insulating film 35 is located outside the outer shape of the internal electrode 32.

When viewed in the sectional view shown in FIG. 2, the insulating film 35 in the first major surface of the silicon semiconductor substrate 10 is greater than the internal electrode 32. When viewed in the plan view shown in FIG. 3, the insulating film 35 is greater than the internal electrode 32 and looks as if it enclose the internal electrode 32. In the example shown in FIG. 3, the internal electrode 32 is rectangular. The shape of the internal electrode 32 is not limited to a rectangle but may be a circle or a polygon.

With this structure, in comparison with a conventional technique in which a thin insulating film is arranged between a through-electrode and a silicon semiconductor substrate, the capacitance between the through-electrode 37 and the silicon semiconductor substrate 10 can be reduced, and the time constant of the through-electrode 37 can be decreased. In this manner, power supplied from the solder ball 18 can be prevented from being degraded. Furthermore, the influence of power supply noise generated on the silicon semiconductor substrate 10 side can be reduced. For this reason, a desired preferable power supply voltage can be supplied to the imaging element 21 and the peripheral circuit.

A method of manufacturing the through-electrode 37 according to the first embodiment will be described below.

Figure 5:
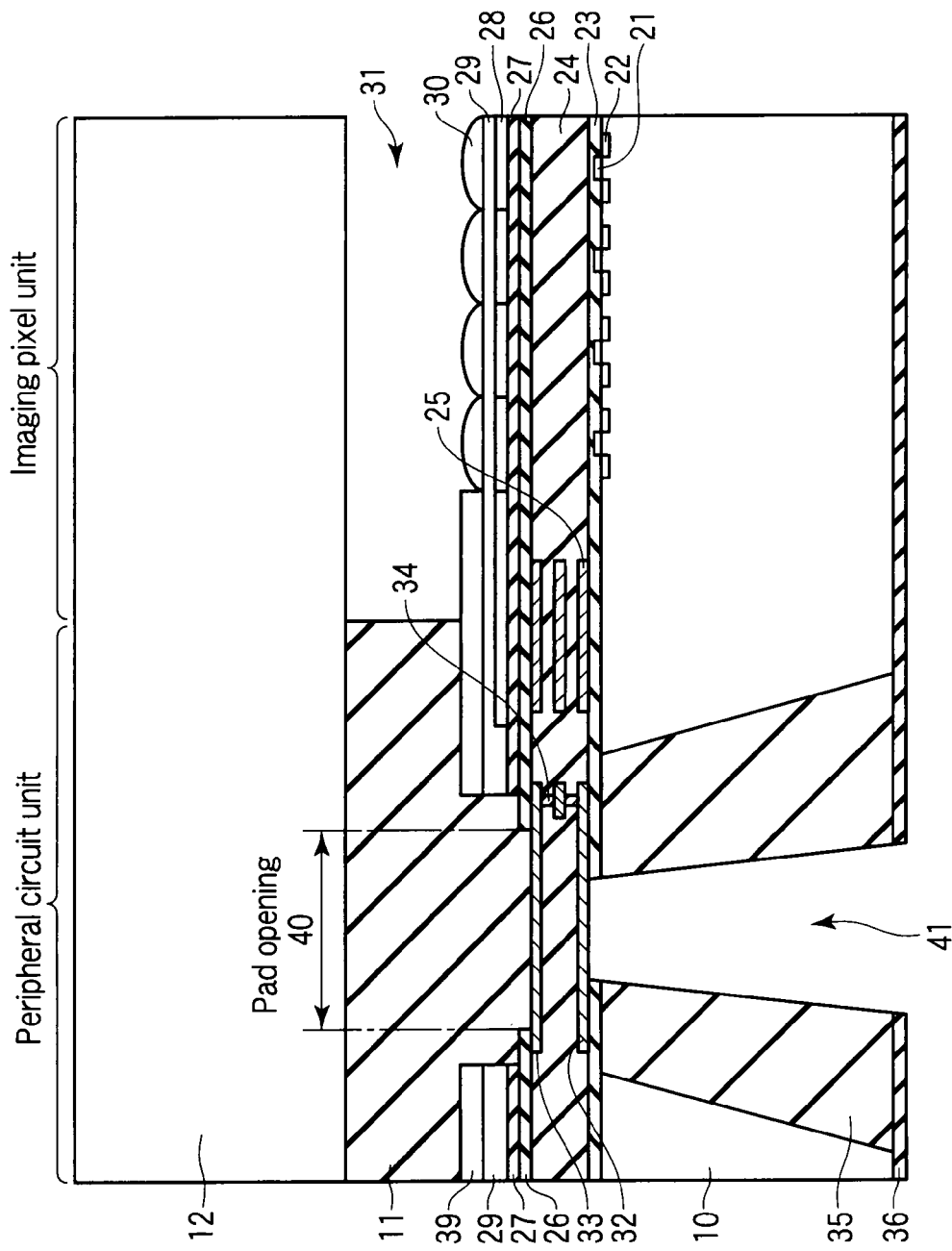

FIGS. 4 and 5 are diagrams showing a method of manufacturing a through-electrode in the camera module according to the first embodiment.

As shown in FIG. 4, a through-hole is formed in the silicon semiconductor substrate 10 and, subsequently, the insulating film 35 is formed in the through-hole. Furthermore, the insulating film 36 is formed on the second major surface of the silicon semiconductor substrate 10.

Subsequently, as shown in FIG. 5, a through-hole 41 reaching the internal electrode 32 is formed in the insulating films 36, 35, and 23. Furthermore, as shown in FIG. 2, the through-electrode 37 is formed on the side surface and the bottom surface of the through-hole 41 and on the second major surface of the silicon semiconductor substrate 10. In this manner, the internal electrode 32 and the through-electrode 37 are electrically connected to each other. Thereafter, the solder resist 38 and the solder ball 18 are formed.

As described above, according to the first embodiment, a thick insulating film is formed between the through-electrode and the silicon semiconductor substrate to make it possible to reduce the capacitance between the through-electrode and the silicon semiconductor substrate. In this manner, the time constant of the through-electrode can be decreased, and degradation of power supplied from an external terminal can be reduced. In contrast to this, the influence of power supply noise generated on the semiconductor substrate side can be considerably reduced. For this reason, a highly reliable solid-state imaging device can be provided.

Second Embodiment

A camera module according to a second embodiment of the present invention will be explained. In the second embodiment, a semiconductor region connected to a ground potential is formed on the silicon semiconductor substrate 10 to surround the circumference of the through-electrode 37.

Figure 7:
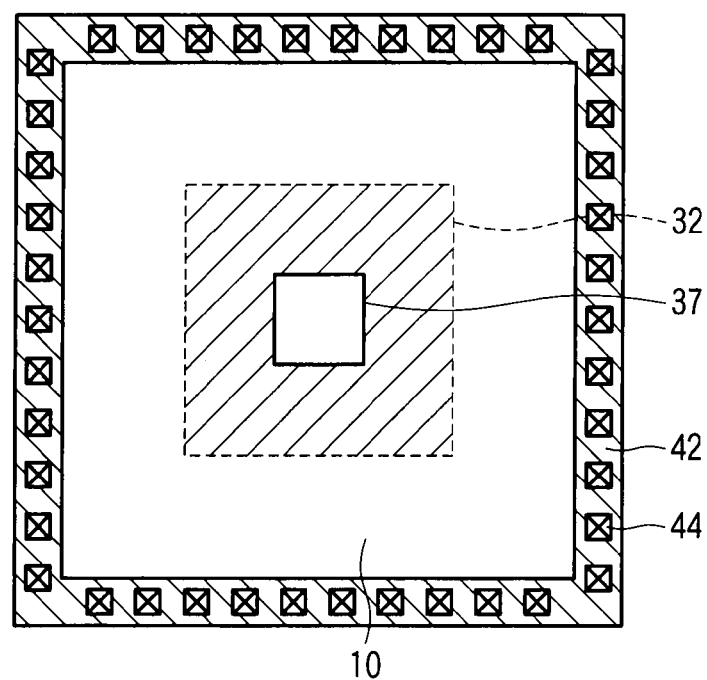
FIG. 7 is a diagram showing a peripheral circuit unit in FIG. 6 as viewed from a pad opening side.

FIG. 6 is a sectional view showing a configuration of the camera module according to the second embodiment. FIG. 7 is a diagram showing a peripheral circuit unit in FIG. 6 as viewed from a pad opening side. FIG. 7 is a plan view showing a layout of a ground region (semiconductor region) 42, the internal electrode 32, and the through-electrode 37.

An imaging pixel unit of the camera module is the same as that in the first embodiment. A structure of the peripheral circuit unit will be explained.

As shown in FIG. 6, the interlayer insulating film 23 is formed on a first major surface of the silicon semiconductor substrate 10, and the internal electrode (first electrode) 32 is formed on the interlayer insulating film 23. A through-hole is formed to extend from the second major surface of the silicon semiconductor substrate 10 to the interlayer insulating film 23 through the first major surface. On the side surface of the through-hole and on the second major surface of the silicon semiconductor substrate 10, an insulating film 45 is formed.

Furthermore, a through-electrode (conductive layer) 37 is formed on an internal surface (on the insulating film 45 and on a surface of the internal electrode 32 on the through-hole side) of the through-hole and on the insulating film 45 on the second major surface. The internal electrode 32 is electrically connected to the imaging element 21 or a peripheral circuit (not shown) formed in the peripheral circuit unit.

The ground region 42 is formed on the first major surface of the silicon semiconductor substrate 10 to surround the circumference of the through-electrode 37. The ground region 42 is constituted by a diffusion layer having a high impurity concentration, and is arranged near the through-electrode 37, for example, is positioned several μm to several tens of μm from the through-electrode 37. In an example shown in FIG. 7, the ground region 42 is formed to surround the entire circumference of the through-electrode 37. However, the ground region 42 may be formed on a part of the circumference of the through-electrode 37.

Furthermore, in the interlayer insulating films 23 and 24 on the ground region 42, an interconnect layer 43 connected to the ground region 42 and a contact plug 44 are formed. A reference potential such as a ground potential is supplied to the ground region 42. For this reason, the ground region 42 is connected to the solder ball 18 having a ground potential through, for example, the interconnect layer 43 and the contact plug 44.

In a conventional structure having no ground region 42, the silicon semiconductor substrate around the through-electrode 37 has a high ground resistance, i.e., the silicon substrate is grounded with a high resistance. However, in the second embodiment, the silicon semiconductor substrate around the through-electrode 37 has a low ground resistance and a stable potential.

For this reason, as in the first embodiment, power supplied from the solder ball 18 can be prevented from being degraded. Furthermore, the influence of power supply noise generated on the silicon semiconductor substrate 10 side can be reduced. In this manner, a desired preferable power supply voltage can be supplied to the imaging element 21 and the peripheral circuit.

As described above, according to the second embodiment, when the ground resistance around the through-electrode is reduced, the time constant of the through-electrode can be reduced, and power supplied from an external terminal can be prevented from being degraded. In contrast to this, the influence of power supply noise generated on the semiconductor substrate side can be considerably reduced. For this reason, a highly reliable solid-state imaging device can be provided.

Third Embodiment

A camera module according to a third embodiment of the present invention will be explained. The third embodiment is obtained by combining the characteristic parts of the first embodiment and the second embodiment to each other. In the third embodiment, a thick insulating film is formed between the through-electrode 37 and the silicon semiconductor substrate 10, and the ground region 42 connected to a ground potential is formed to surround the through-electrode 37.

Figure 8:
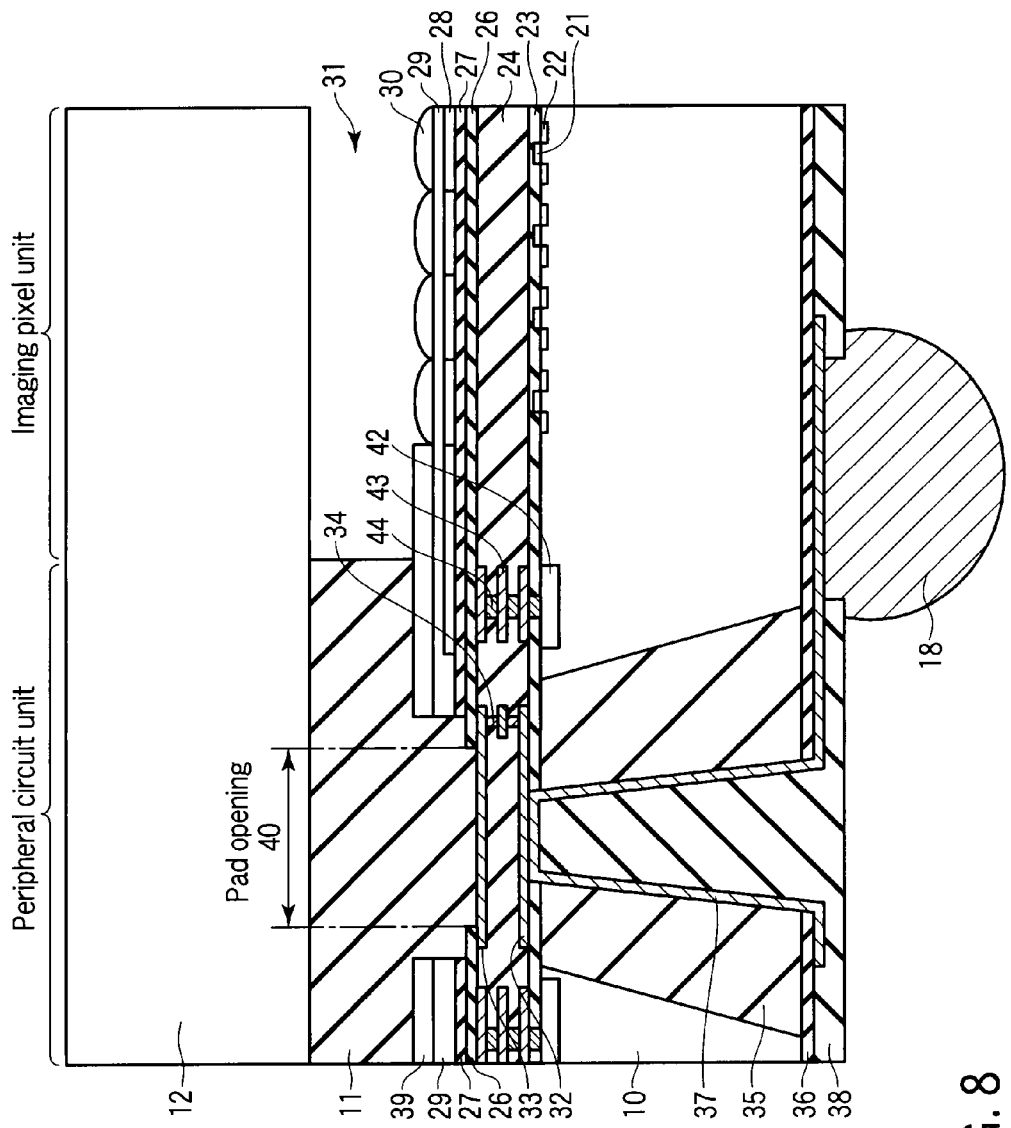
FIG. 8 is a sectional view showing a configuration of a camera module according to a third embodiment of the present invention.
Figure 9:
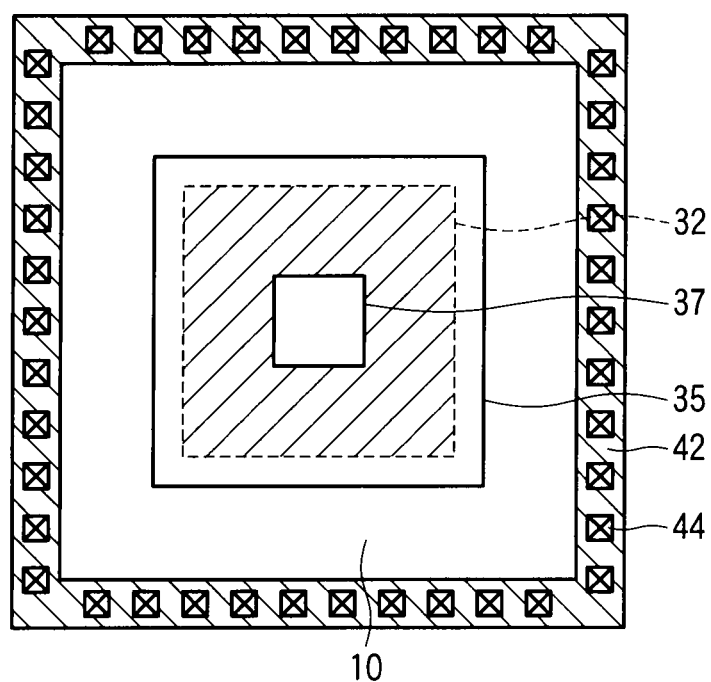
FIG. 9 is a diagram showing a peripheral circuit unit in FIG. 8 as viewed from a pad opening side.

FIG. 8 is a sectional view showing a configuration of the camera module according to the third embodiment. FIG. 9 is a diagram showing a peripheral circuit unit in FIG. 8 as viewed from a pad opening side. FIG. 9 is a plan view showing a layout of the ground region 42, the insulating film 35, the internal electrode 32, and the through-electrode 37.

As shown in FIGS. 8 and 9, the thick insulating film 35 is formed between the through-electrode 37 and the silicon semiconductor substrate 10. Furthermore, on the first major surface of the silicon semiconductor substrate 10, the ground region 42 connected to a ground potential is formed to surround the through-electrode 37. The other configuration is the same as those in the first and second embodiments.

According to the third embodiment, a solid-state imaging device having an effect greater than those of the first and second embodiments and a reliability higher than those of the first and second embodiments can be provided.

According to the embodiments of the present invention, a solid-state imaging device which can reduce degradation of power supplied from an electrode of a semiconductor substrate comprising a through-electrode and can reduce the influence of power supply noise generated on a semiconductor substrate side can be provided.

Each of the embodiments described above can be singularly executed. In addition, the embodiments can be executed by being combined to each other. Furthermore, the embodiments include inventions in various phases. The plurality of constituent elements disclosed in the embodiments are combined to each other appropriately to make it possible to extract the inventions in the various phases.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
  an imaging element formed in a region including a first major surface of a semiconductor substrate;
  an external terminal formed on a second major surface opposing the first major surface of the semiconductor substrate;
  a through-electrode formed in a through-hole formed in the semiconductor substrate and electrically connected to the external terminal;
  a first electrode formed on the through-electrode on the first major surface of the semiconductor substrate;
  a semiconductor region formed in the semiconductor substrate to surround at least a part of a circumference of the through-electrode, the semiconductor region being a diffusion layer having a high impurity concentration and being located adjacent to the through-electrode; and
  an interconnect layer formed on the semiconductor region and electrically connected to the semiconductor region, wherein a ground potential is supplied to the semiconductor region through the interconnect layer.

2. The solid-state imaging device according to claim 1, further comprising:
  an interlayer insulating film formed on the first electrode and the first major surface of the semiconductor substrate;
  a second electrode formed on the interlayer insulating film;
  a passivation film formed on the second electrode and the interlayer insulating film and having an opening in which a part of the second electrode is exposed; and
  a contact plug connected and formed between the second electrode and the first electrode.

3. The solid-state imaging device according to claim 1, further comprising:
  a color filter provided on the imaging element to correspond to the imaging element; and
  a microlens provided on the color filter.

* * * * *